(12) United States Patent
Urimoto

(10) Patent No.: US 10,539,974 B2
(45) Date of Patent: Jan. 21, 2020

(54) CASING FOR ELECTRONIC APPARATUS AND ELECTRONIC APPARATUS HAVING SAME

(71) Applicant: Panasonic Intellectual Property Management Co., Ltd., Osaka (JP)

(72) Inventor: Tetsuya Urimoto, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/150,774

(22) Filed: Oct. 3, 2018

(65) Prior Publication Data
US 2019/0033915 A1    Jan. 31, 2019

Related U.S. Application Data

(63) Continuation of application No. PCT/JP2017/012731, filed on Mar. 28, 2017.

(30) Foreign Application Priority Data

Apr. 5, 2016   (JP) .................................. 2016-076052

(51) Int. Cl.
*H05K 5/02* (2006.01)
*G06F 1/16* (2006.01)
*H05K 5/00* (2006.01)

(52) U.S. Cl.
CPC .......... *G06F 1/1607* (2013.01); *G06F 1/1637* (2013.01); *H05K 5/0086* (2013.01); *H05K 5/0217* (2013.01)

(58) Field of Classification Search
CPC ........ G06F 1/1607; G06F 1/1637; G06F 1/16; H05K 5/0086; H05K 5/02; H05K 5/0217
See application file for complete search history.

(56) References Cited

U.S. PATENT DOCUMENTS

| 5,485,723 A * | 1/1996 | McCoy | F01D 21/045 |
| | | | 415/200 |
| 2008/0232058 A1* | 9/2008 | Horiuchi | G06F 1/1616 |
| | | | 361/679.55 |
| 2010/0321870 A1* | 12/2010 | Hirai | G06F 1/1656 |
| | | | 361/679.01 |

(Continued)

FOREIGN PATENT DOCUMENTS

| JP | 8-296293 | 11/1996 |
| JP | 9-512609 | 12/1997 |

(Continued)

OTHER PUBLICATIONS

International Search Report dated May 23, 2017 in International (PCT) Application No. PCT/JP2017/012731.

(Continued)

*Primary Examiner* — Hoa C Nguyen
*Assistant Examiner* — Keith DePew
(74) *Attorney, Agent, or Firm* — Wenderoth, Lind & Ponack, L.L.P.

(57) ABSTRACT

In a casing for an electronic apparatus, a plurality of ribs are integrally formed on an inner surface of the casing, and the plurality of ribs form an isogrid structure in which a plurality of equilateral-triangular segments are arranged regularly adjacent to each other.

6 Claims, 7 Drawing Sheets

(56) References Cited

U.S. PATENT DOCUMENTS

| | | | | |
|---|---|---|---|---|
| 2011/0128683 A1* | 6/2011 | Hirao | G06F 1/1616 | 361/679.01 |
| 2013/0057781 A1* | 3/2013 | Hirai | G06F 1/1601 | 348/836 |
| 2013/0057782 A1* | 3/2013 | Takahashi | H04N 5/64 | 348/836 |
| 2015/0064394 A1* | 3/2015 | Gwin | B29D 99/006 | 428/116 |
| 2015/0103501 A1* | 4/2015 | Hirai | G06F 1/1633 | 361/752 |
| 2016/0054762 A1* | 2/2016 | Garelli | G06F 1/1656 | 361/679.55 |

FOREIGN PATENT DOCUMENTS

| | | |
|---|---|---|
| JP | 2000-323858 | 11/2000 |
| JP | 2002-45956 | 2/2002 |
| JP | 2008-234100 | 10/2008 |
| JP | 2011-8356 | 1/2011 |

OTHER PUBLICATIONS

English Translation of International Preliminary Report on Patentability dated Oct. 9, 2018 in International (PCT) Application No. PCT/JP2017/012731.

* cited by examiner

CASING FOR ELECTRONIC APPARATUS AND ELECTRONIC APPARATUS HAVING SAME

CROSS-REFERENCE TO RELATED APPLICATIONS

This is a continuation application of International Application No. PCT/JP2017/012731, with an international filing date of Mar. 28, 2017, which claims priority of Japanese Patent Application No. 2016-076052 filed on Apr. 5, 2016, the content of which is incorporated herein by reference.

BACKGROUND

1. Technical Field

The present disclosure relates to a casing for an electronic apparatus and an electronic apparatus having the same.

2. Related Art

JP 2008-234100 A discloses a structure in which a plurality of ribs are provided so that a plurality of adjacent honeycomb cells are formed on an inner surface of a panel of a casing as a reinforcing structure of a casing for an electronic apparatus.

SUMMARY

It is an object of the present disclosure to provide a casing for an electronic apparatus which is reduced in weight while the rigidity of the casing is increased and an electronic apparatus having the same.

In a casing for an electronic apparatus according to the present disclosure, a plurality of ribs are integrally formed on an inner surface of the casing, and the plurality of ribs form an isogrid structure in which a plurality of equilateral-triangular segments are arranged regularly adjacent to each other.

An electronic apparatus according to the present disclosure includes a casing for an electronic apparatus according to the present disclosure.

According to the present disclosure, it is possible to reduce the weight of a casing for an electronic apparatus while the rigidity of the casing is increased.

DETAILED DESCRIPTION

Embodiments will be described in detail below with reference to the accompanying drawings as appropriate. However, an unnecessarily detailed description may be omitted. For example, a detailed description of already well-known matters and a redundant description of substantially the same configuration may be omitted. This is to avoid the unnecessary redundancy of the following description and to facilitate understanding by those skilled in the art.

It should be noted that the present inventor provides the accompanying drawings and the following description so as to enable those skilled in the art to sufficiently understand the present disclosure, which are not intended to limit the claimed subject matter.

Background of the Invention

Due to the recent reduction in thickness of an electronic apparatus, casing bodies are required to be thin and have rigidity. Accordingly, ribs are added to a casing to increase the rigidity.

There is an isogrid structure as a structure that can dramatically increase the rigidity of the casing. The isogrid structure is a structure in which equilateral-triangular segments are regularly arranged. The isogrid structure is used for a body for a rocket, a ship, or the like and is formed by cutting.

However, cutting work has been very expensive and hence difficult to apply to general-purpose electronic apparatuses required to be low in cost.

In order to cope with this, the present inventor has examined whether it is possible to form an isogrid structure by casting capable of reducing cost. However, in the conventional isogrid structures, sufficient fluidity of the molten metal in molds can not be obtained, and as a result, satisfactory filling reliability can not be obtained and the molding defect rate is high.

Therefore, the present disclosure specifically aims to improve the filling reliability and reduce the molding defect rate in the case of molding an isogrid structure by casting. It is an object of the present disclosure to provide a casing for an electronic apparatus, which is reduced in weight while the rigidity of the casing is increased, and an electronic apparatus having the same.

First Embodiment

In the following, the first embodiment will be described with reference to the drawings.

1. Configuration

[1-1. Overview of Electronic Apparatus]

Figure 1:
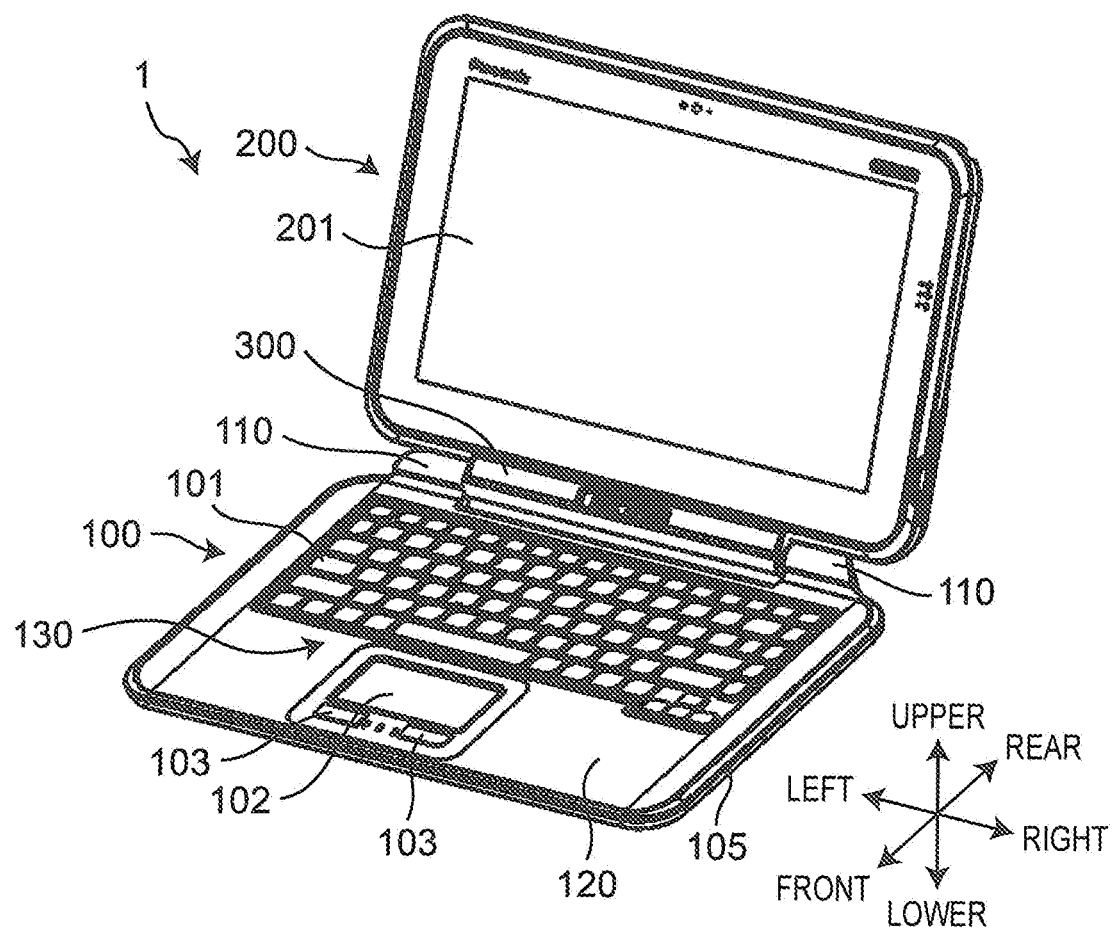
FIG. 1 is a perspective view showing an appearance of a front side of an electronic apparatus according to an embodiment in an opened state.
Figure 2:
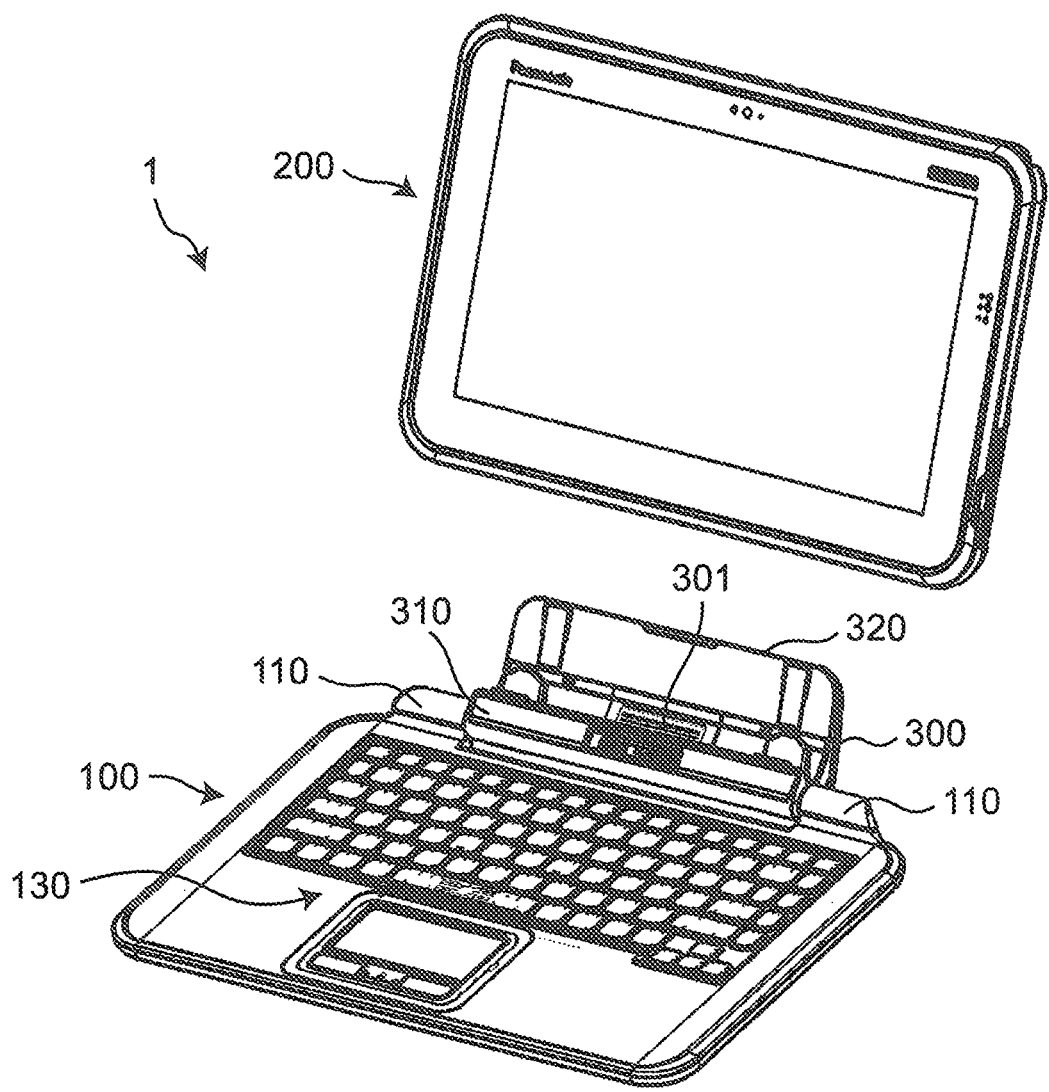
FIG. 2 is a perspective view of the front side of the electronic apparatus according to the embodiment in a state in which a second unit of the electronic apparatus is removed.

FIG. 1 is a perspective view showing an appearance of a front side of an electronic apparatus according to the embodiment in an opened state. FIG. 2 is a perspective view of the front side of the electronic apparatus according to the embodiment in a state in which a second unit of the electronic apparatus is removed.

As shown in FIGS. 1 and 2, an electronic apparatus 1 includes a first unit 100 including an operation unit 130, a second unit 200 including a display unit 201, and a holder 300 which is rotatably coupled to the first unit 100 and to which the second unit 200 is detachably connected. The electronic apparatus 1 is configured as a so-called detachable type computer. It should be noted that the definition of directions shown in FIG. 1 is for convenience of explanation, and is described based on a state where the user uses the notebook-type computer in a general state as shown in FIG. 1.

The first unit 100 is an operation unit for accepting the user's input operation. The casing of the first unit 100 is made of metal such as magnesium alloy or resin. As the operation unit 130, the first unit 100 includes a keyboard 101, a touch pad 102, a plurality of operation buttons 103, and the like for the user to perform input processing. In addition, the first unit 100 has an arithmetic processing unit that performs processing or the like of outputting signals corresponding to the operations on the keyboard 101, the touch pad 102, and the plurality of operation buttons 103.

The second unit 200 is a tablet-type computer. The casing of the second unit 200 is made of metal such as magnesium alloy or resin. The display unit 201 includes, for example, a liquid crystal display panel. The display unit 201 is a touch panel capable of accepting the user's touch operation. The second unit 200 has a central processing unit (CPU), a volatile storage device (RAM), a nonvolatile storage device (ROM, SSD, and the like), a battery, and the like. In the nonvolatile storage device (ROM, SSD, and the like), an operating system (OS), various application programs, various types of data, and the like are stored. The central processing unit (CPU) achieves various functions by reading the OS, application programs, various types of data to execute arithmetic processing.

The holder 300 can accommodate the lower side of the second unit 200. The holder 300 is rotatably supported with respect to the first unit 100 with a hinge portion 110 of the first unit 100. The holder 300 is configured so that the second unit 200 is detachable.

The holder 300 is provided with a connector 301 to be connected to a connector (not shown) of the second unit 200 with the lower side portion of the second unit 200 accommodated. The connector 301 of the holder 300 is electrically signal-connected to the arithmetic processing unit of the first unit 100. Various signals and electric power can be exchanged between the first unit 100 and the second unit 200 through these connectors. For example, signals output from the input unit such as the keyboard 101, the touch pad 102, and the plurality of operation buttons 103, and the like of the first unit 100 can be output to the second unit 200. The second unit 200 can receive these signals and perform control based on the received signals. Therefore, according to the electronic apparatus 1, the first unit 100 can be used as a notebook-type computer with the second unit 200 attached. In addition, the second unit 200 alone can be used as a tablet-type computer.

[1-2. Structure of Casing of First Unit]

The casing of the first unit 100 includes an upper casing 120 constituting an upper surface side of the first unit 100 and a lower casing 130 constituting a lower surface side of the first unit 100.

Figure 3:
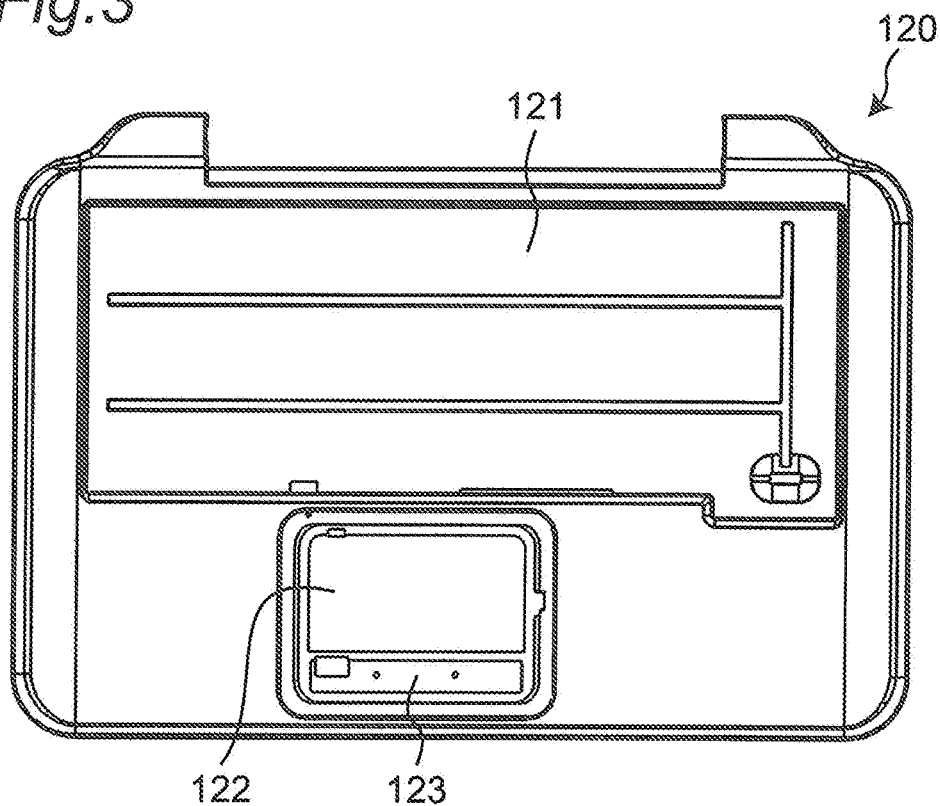
FIG. 3 is a top view of an upper casing of a first unit.

FIG. 3 is a top view of the upper casing 120 of the first unit 100.

Recesses 121, 122, and 123 for disposing the keyboard 101, the touch pad 102, the plurality of operation buttons 103, and the like are formed in the upper casing 120. Further, right and left sides of the recess 122 for disposing the touch pad 102 are palm rests. The upper casing 120 according to the embodiment is made of a magnesium alloy and is formed by casting using a molten magnesium alloy.

Figure 4:
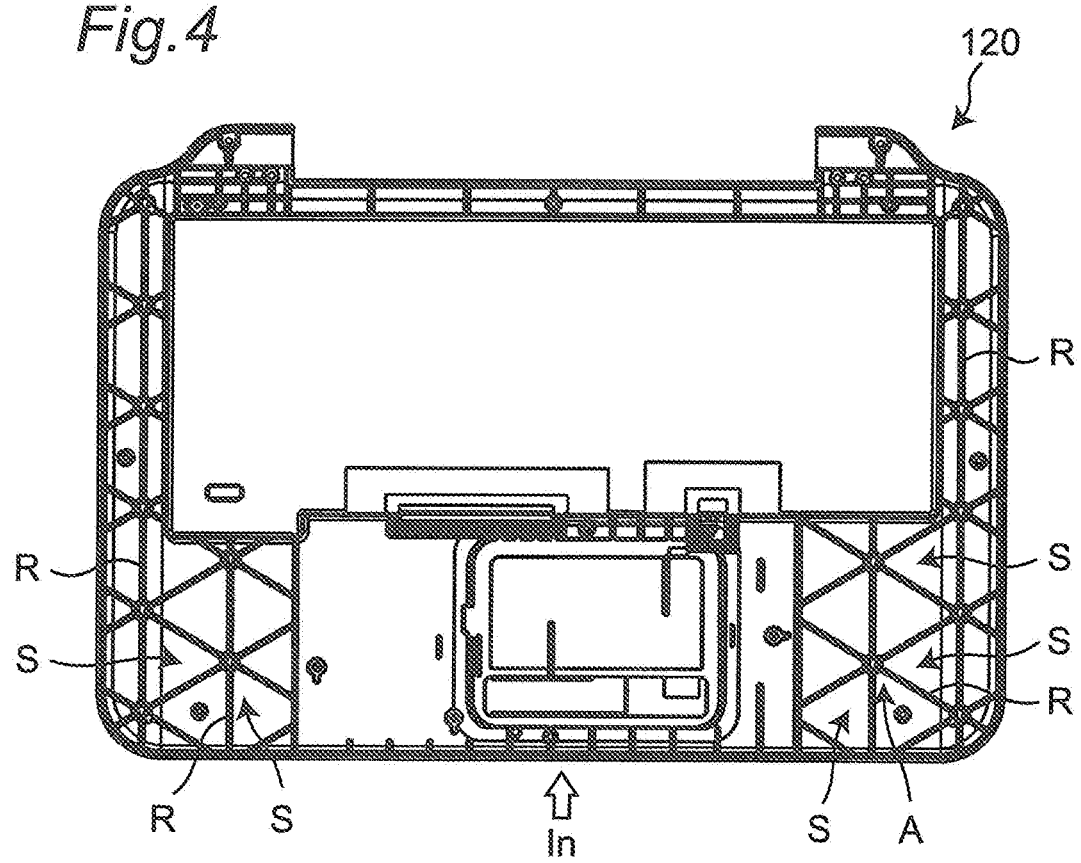
FIG. 4 is a bottom view of the upper casing of the first unit.

FIG. 4 is a bottom view of the upper casing 120 of the first unit 100.

On the lower surface of the upper casing 120 of the first unit 100, a plurality of ribs R are provided in portions excluding the recesses 121, 122, and 123 so as to form an isogrid structure in which a plurality of equilateral triangular segments S are arranged regularly adjacent to each other. The upper casing 120 is formed by injecting a molten magnesium alloy from the position indicated by "In" on the front side portion (the lower side portion in FIG. 4).

Figure 5:
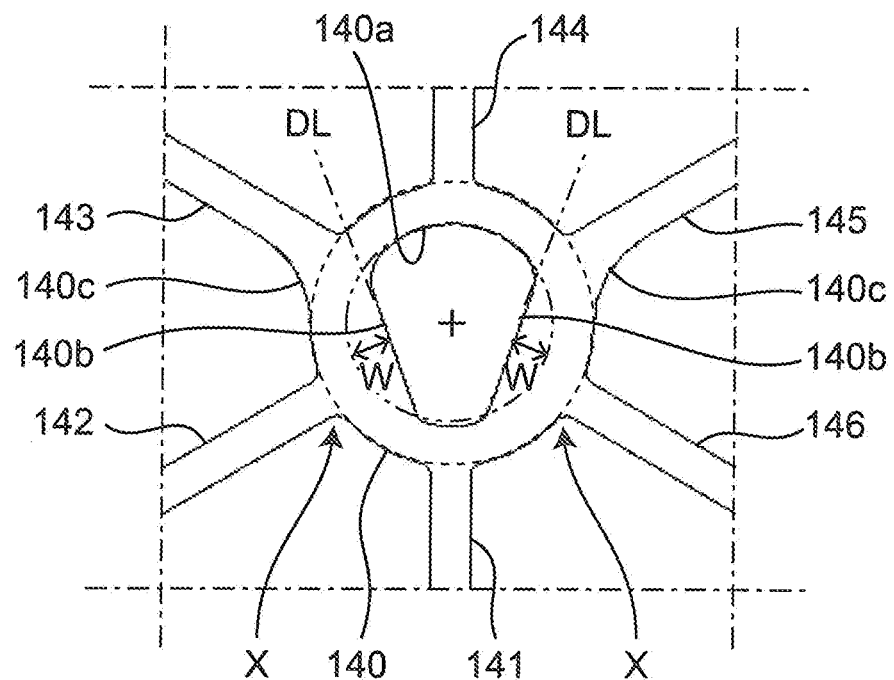
FIG. 5 is an enlarged view of an isogrid structure according to the embodiment.

FIG. 5 is an enlarged view of the isogrid structure according to the embodiment. Specifically, FIG. 5 is an enlarged view centered on one of the nodal portions, at which the vertices of equilateral triangles in an isogrid structure indicated by arrow A in FIG. 4 gather together and with which a plurality of ribs R intersect.

The isogrid structure according to the embodiment includes first to sixth linear ribs 141 to 146 constituting sides of equilateral triangles and an annular rib 140 which is disposed at the vertexes of the equilateral triangles and to which the first to sixth linear ribs 141 to 146 are connected. These ribs 140 to 146 are part of the plurality of ribs R described above.

The first to sixth linear ribs 141 to 146 radially extend from the annular rib 140 at angular intervals of 60° in a circumferential direction.

In the isogrid structure according to the embodiment, an inner periphery 140a of the annular rib 140 is not a perfect circle but a fan shape. A portion (indicated by arrow X) of the annular rib 140 to which each of the second and sixth linear ribs 142 and 146 is connected is formed to have a width (a length in a radial direction) larger by a width W than a portion of the annular rib 140 to which each of the first, third, fourth, and fifth linear ribs 141, 143, 144, and 145 is connected.

The inner periphery 140a of the annular rib 140 has a linear portion 140b connecting a neighboring portion of the first linear rib 141 and a neighboring portion of the third linear rib 143 in the shape of a straight line DL and a linear portion 140b connecting a neighboring portion of the first linear rib 141 and a neighboring portion of the fifth linear rib 145 in the shape of a straight line DL. Further, portions 140c, of the annular rib 140, to which the third and fifth linear ribs 143 and 145 are connected and which are located on a side of the second linear rib 142 and a side of the sixth linear rib 146 are smaller in curvature than the other portions to which the linear ribs are connected.

[1-3. Conventional Isogrid Structure]

Figure 6:
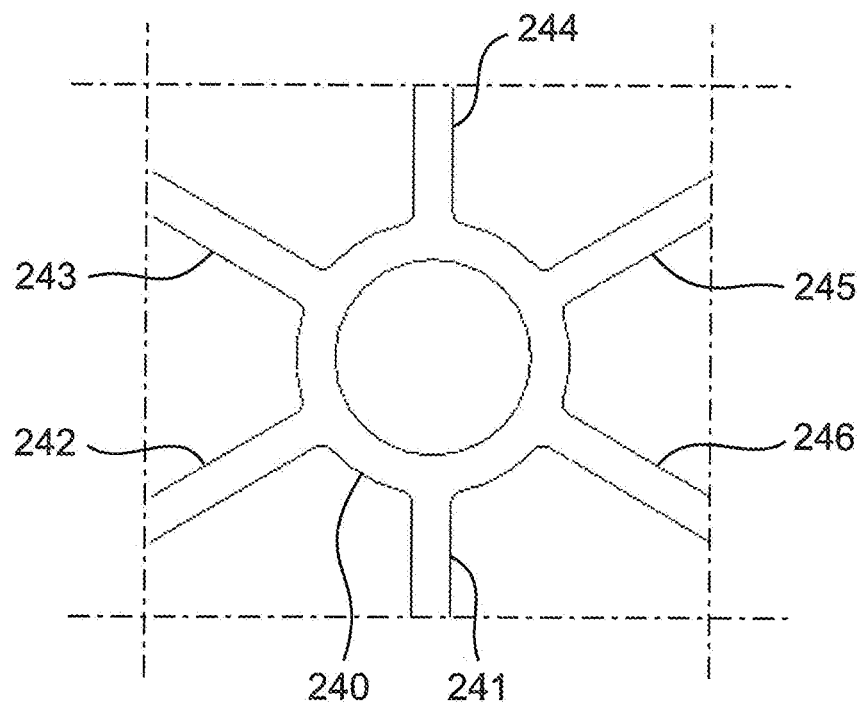
FIG. 6 is an enlarged view of a conventional isogrid structure.

The reason why the shape of the annular rib 140 is a non-circular shape as described above will be described in comparison with the general isogrid structure shown in FIG. 6. FIG. 6 is an enlarged view of a conventional isogrid structure.

In the conventional general isogrid structure shown in FIG. 6, an outer periphery and an inner periphery of an annular rib 240 each are formed substantially in a perfect circle shape. In addition, this structure includes first to sixth linear ribs 241 to 246 extending radially.

The present inventor has examined the use of a conventional isogrid structure shown in FIG. 6 in order to increase the strength of the casing for the electronic apparatus. However, as described above, although a conventional isogrid structure is formed by cutting, cutting work has been very expensive and hence difficult to apply to general-purpose electronic apparatuses required to be low in cost. In order to cope with this, the present inventor has examined whether it is possible to form an isogrid structure by casting capable of reducing cost. However, in the conventional isogrid structures, sufficient fluidity of the molten metal in molds can not be obtained, and as a result, satisfactory filling reliability can not be obtained and the molding defect rate is high. As a result of examination, the present inventor has found the following reason.

Figure 7:
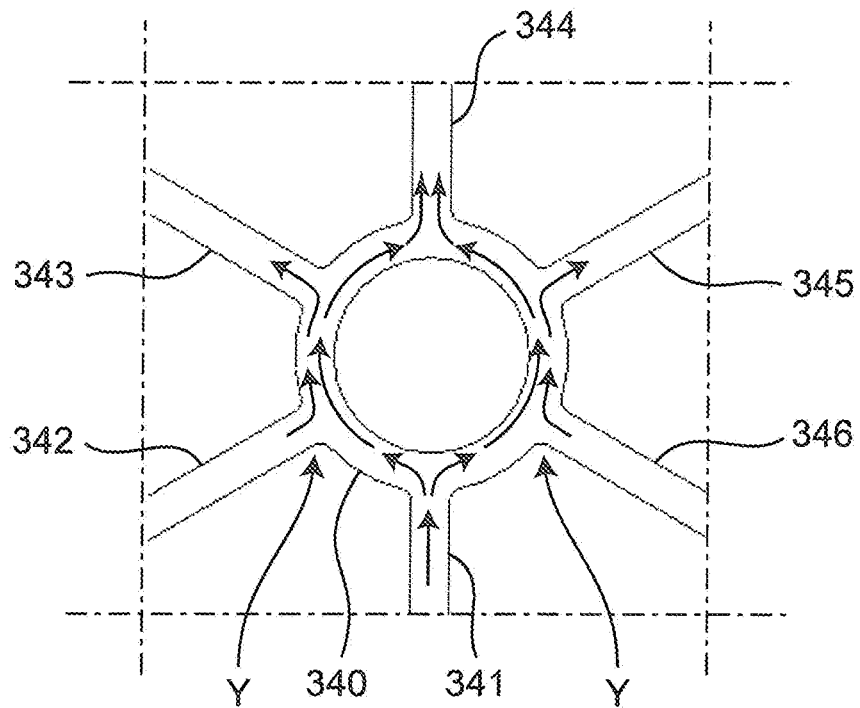
FIG. 7 is a view for describing problems in the case of molding the conventional isogrid structure by casting.

FIG. 7 is an enlarged view of one annular rib portion of one of, a pair of molds used for manufacturing a conventional isogrid structure by casting, which is located on the side where grooves for forming ribs of the isogrid structure are formed.

The mold has an annular groove 340 and first to sixth linear grooves 341 to 346 radially extending from the annular groove 340 at angular intervals of 60° in the circumferential direction.

Referring to FIG. 7, the first, second, and sixth linear grooves 341, 342, and 346 extending downward and diagonally downward from the annular groove 340 are located on an upstream side of the annular groove 340 in a flowing direction of the molten magnesium alloy. Referring to FIG. 7, the third, fourth, and fifth linear grooves 343, 344, and 345 extending upward and diagonally upward from the annular groove 340 are located on a downstream side of the annular groove 340. Therefore, the molten magnesium alloy flows in each groove as indicated by arrows in FIG. 7. In this case, referring to FIG. 7, in the portion (indicated by arrow Y) where the second and sixth linear grooves 342 and 346 are connected to the annular groove 340, the molten magnesium alloy flowing from the first linear groove 341 and the molten magnesium alloy flowing from the second and sixth linear grooves 345 and 346 converge, so that the pressure rises and the flow resistance when the molten magnesium alloy flows to the downstream side in the annular groove 340 increases. As a result, it has been found that it is difficult for the molten magnesium alloy to spread to the most downstream side of the mold, and it is difficult to secure the quality of the cast molded product with a predetermined quality.

[1-4. Casting of Isogrid Structure According to Embodiment]

Figure 8:
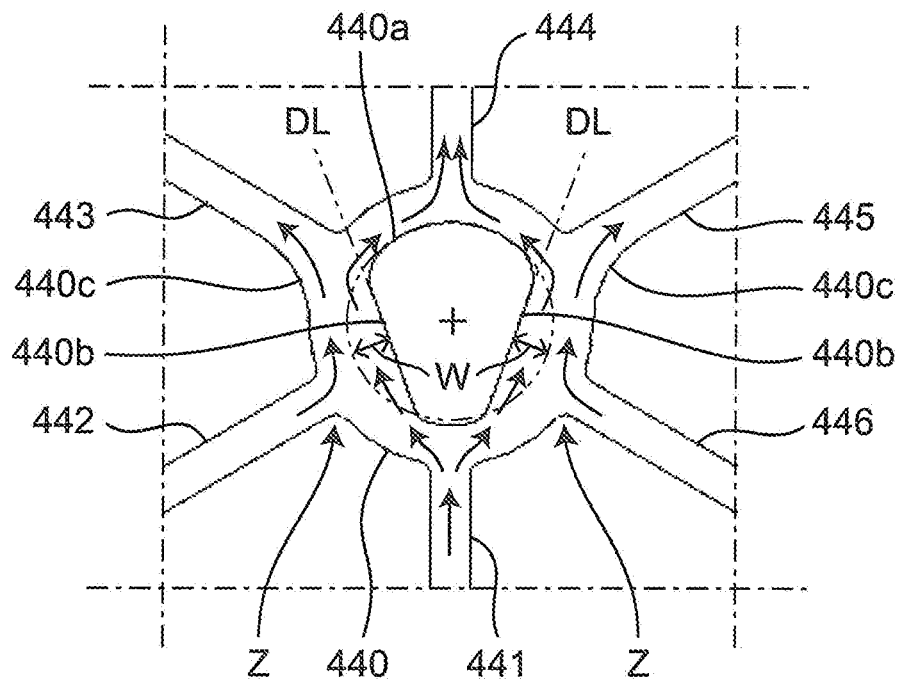
FIG. 8 is a view for describing an effect obtained when the isogrid structure according to the embodiment is molded by casting.

FIG. 8 is an enlarged view of one annular rib portion of one of, a pair of molds used for manufacturing an isogrid structure according to the embodiment by casting, which is located on the side where grooves for forming ribs constituting the isogrid structure are formed.

In the embodiment, an inner periphery 440a of an annular groove 440 is not a perfect circle but a fan shape. A portion (indicated by arrow Z) of the annular groove 440 to which each of second and sixth linear grooves 442 and 446 is connected is formed to have a width (the length in the radial direction) larger by a width W than a portion of the annular groove 440 to which each of the first, third, fourth, and fifth linear grooves 441, 443, 444, and 445 is connected. Even if the molten magnesium alloy flowing from the second and sixth linear grooves 442 and 446 into the annular groove 440 and the molten magnesium alloy flowing from the first linear groove 441 on the upstream side converge, the pressure rise hardly occurs at the confluent portion indicated by arrow Z to the annular groove 440. Therefore, an increase in flow resistance when the molten magnesium alloy flows to the downstream side in the annular groove 440 is suppressed.

The inner periphery 440a of the annular groove 440 has a linear portion 440b connecting a neighboring portion of the first linear groove 441 and a neighboring portion of the third linear groove 443 in the shape of a straight line DL and a linear portion 440b connecting neighboring portion of the first linear groove 441 and a neighboring portion of the fifth linear groove 445 in the shape of a straight line DL. Therefore, the molten magnesium alloy flowing from the first linear groove 441 into the annular groove 440 is smoothly guided to the downstream side by the linear portion 440b, and flows into the third and fifth linear grooves 443 and 445 more easily. Further, portions 440c, of the annular groove 440, to which the third and fifth linear grooves 443 and 445 are connected and which are located on a side of the second linear groove 442 and a side of the sixth linear groove 446 are smaller in curvature than the other portions to which the linear grooves are connected. This also makes it easier for molten magnesium alloy to flow from the annular groove 440 into the third and fifth linear grooves 443 and 445. These structures further suppress an increase in pressure between the portion where the second linear groove 442 is connected and the portion where the third linear groove 443 is connected, and an increase in pressure between the portion where the sixth linear groove 446 is connected and the portion where the fifth linear groove 445 is connected. Therefore, an increase in flow resistance when the molten magnesium alloy flows to the downstream side in the annular groove 440 is suppressed.

Figure 9A:
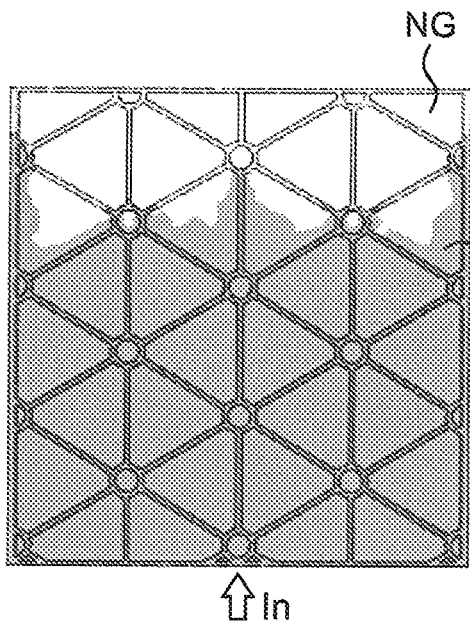
FIGS. 9A and 9B are diagrams comparing filling reliability implemented by the conventional isogrid structure with filling reliability implemented by the isogrid structure according to the embodiment.
Figure 9B:
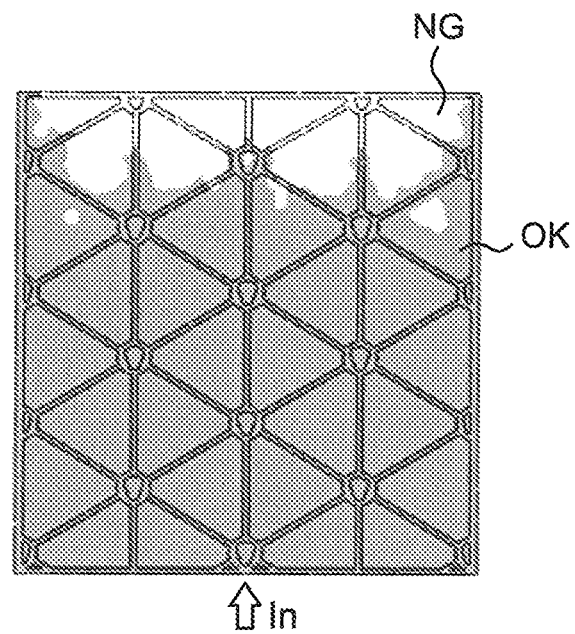

FIGS. 9A and 9B are diagrams comparing the filling reliability implemented by the conventional isogrid structure with the filling reliability implemented by the isogrid structure according to the embodiment. It should be noted that these diagrams indicate states in the course of filling. FIG. 9A is a diagram showing the filling reliability implemented by the conventional isogrid structure. FIG. 9B is a diagram showing the filling reliability implemented by the isogrid structure according to the embodiment. These examples indicate a case in which a molten magnesium alloy is injected from the portion indicated by "In". In these drawings, the portion expressed as "OK" with high density indicates the portion where sufficient filling reliability is obtained, and the portion indicated by "NG" with low density indicates the portion where sufficient filling reliability is not obtained. As is obvious from FIGS. 9A and 9B, the filling reliability is improved by the isogrid structure according to the embodiment. This is because the fluidity of the molten magnesium alloy in the mold is improved.

As described above, the isogrid structure according to the embodiment improves the filling reliability in the case in which the isogrid structure is formed by casting, and reduces the molding defect rate. Therefore, it is possible to form a casing having an isogrid structure with good quality while using casting. Therefore, a casing having an isogrid structure can be inexpensively manufactured, and a casing having an isogrid structure can be adopted to an electronic apparatus. It is, therefore, possible to provide a casing for an electronic apparatus, which is reduced in weight while the rigidity of the casing is increased, and an electronic apparatus having the same.

2. Effects and Others

The upper casing 120 (the casing for the electronic apparatus) according to the embodiment has
the plurality of ribs R integrally formed on the inner surface of the upper casing 120 (casing), and
the plurality of ribs R form the isogrid structure in which the plurality of equilateral triangular segments S are arranged regularly adjacent to each other.

As a result, it is possible to reduce the weight of the upper casing 120 (casing) for the electronic apparatus while the rigidity of the upper casing 120 is increased.

In the upper casing 120 (the casing for the electronic apparatus) according to the embodiment
the plurality of ribs R include the annular rib 140 provided at the positions of the vertices of the plurality of adjacent equilateral triangles and the linear ribs 141 to 146 radially extending from the annular rib 140 at angular intervals of 60° in the circumferential direction and constituting the respective sides of the equilateral triangles.

The width of the portion of the annular rib 140 to which each of the pair of linear ribs 142 and 146 adjacent to one linear rib 141 in the circumferential direction is connected is set to be larger than the width of the portion of the annular rib 140 to which each of the remaining linear ribs 141, 143, 144, and 145 is connected.

This improves the filling reliability in the case in which an isogrid structure is formed by casting, thereby reducing the molding defect rate. Therefore, it is possible to form a casing having an isogrid structure with good quality while using casting.

In the upper casing 120 (the casing for the electronic apparatus) according to the embodiment,
the upper casing 120 (the casing) is a cast product.

This makes it possible to inexpensively manufacture a casing having an isogrid structure.

The electronic apparatus 1 according to the embodiment has the upper casing 120 (the casing for the electronic apparatus) according to the embodiment.

Other Embodiments

As described above, the first embodiment has been described as an example of the technique in the present disclosure. However, the technique in the present disclosure is not limited to this, and can also be applied to embodiments in which changes, substitutions, additions, omissions, and the like are made as appropriate.

Accordingly, other embodiments will be described below.

Figure 10:
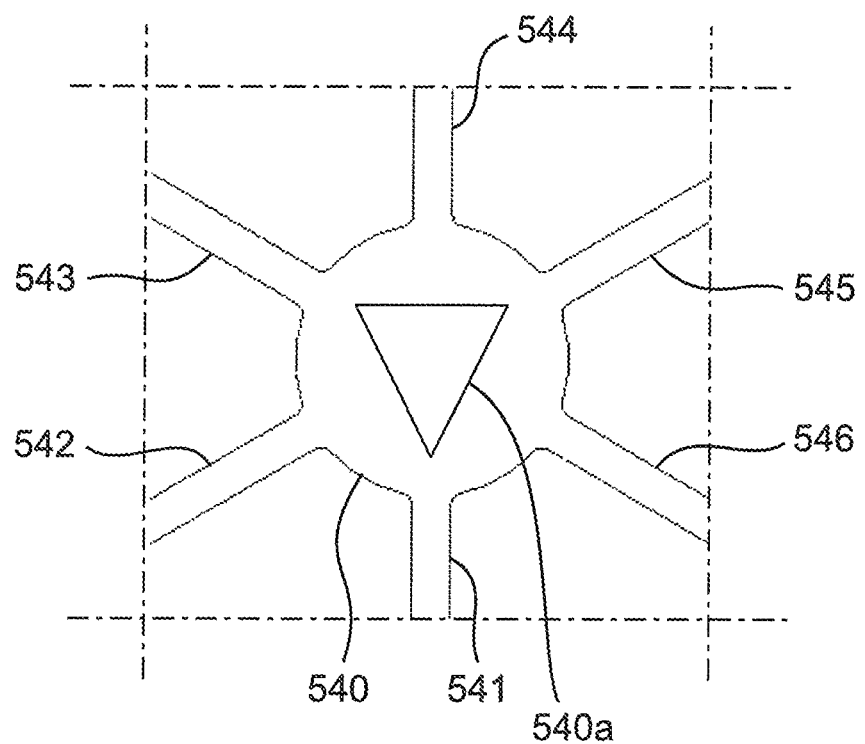
FIG. 10 is an enlarged view of an isogrid structure according to another embodiment.

The above embodiment has exemplified the case in which the inner periphery of the annular rib has a fan shape. However, the present disclosure is not limited to this. In the present disclosure, the width of the portion of the annular rib to which each of the pair of linear ribs adjacent to one linear rib in the circumferential direction is connected may be set to be larger than the width of the portion of the annular rib to which each of the remaining linear ribs is connected For example, as shown in FIG. 10, an inner periphery 540a of an annular rib 540 may have a triangular shape. Even in this case, the width of a portion of the annular rib 540 to which each of a pair of linear ribs 542 and 546 adjacent to one linear rib 541 in the circumferential direction is connected is larger than the width of a portion of the annular rib 540 to which each of remaining linear ribs 541, 543, 544, and 545 is connected.

Figure 11:
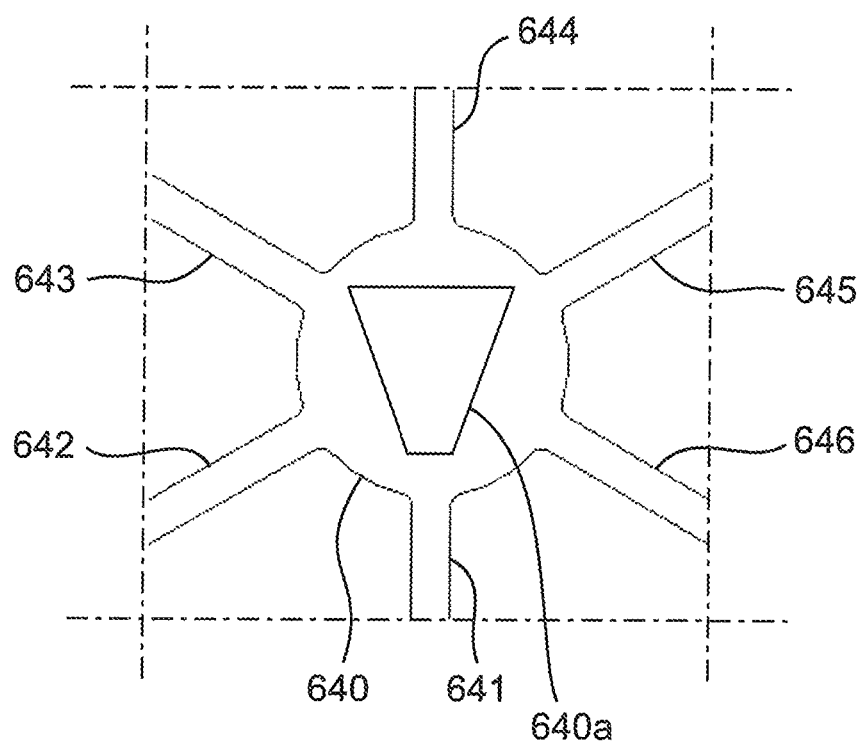
FIG. 11 is an enlarged view of an isogrid structure according to still another embodiment.

As shown in FIG. 11, an inner periphery 640a of an annular rib 640 may have a trapezoidal shape. Even in this case, the width of a portion of the annular rib 640 to which each of a pair of linear ribs 642 and 646 adjacent to one linear rib 641 in the circumferential direction is connected is larger than the width of a portion of the annular rib 640 to which each of remaining linear ribs 641, 643, 644, and 645 is connected.

The embodiment has exemplified the case in which the casing for the electronic apparatus according to the present disclosure is applied to the upper casing 120. Obviously, however, the casing for the electronic apparatus according to the present disclosure can be applied to other casing bodies.

The embodiment liar also exemplified the case in which the first unit 100 and the second unit 200 are configured to be detachable via the holder 300 (connecting portion). However, the present disclosure is also applicable to a general notebook type electronic apparatus in which the first unit and the second unit are not detachable. It is also applicable to tablet terminals, smartphones, and the like.

As described above, each of the embodiments has been described as an example of the technique in the present disclosure. For this purpose, the accompanying drawings and detailed description are provided.

Accordingly, some of the constituent elements described in the accompanying drawings and the detailed description include not only essential constituent elements for solving the problem but also constituent elements which are not essential for solving the problem. For this reason, it should not be immediately regarded that these components that are not essential are essential since they are described in the accompanying drawings and the detailed description.

Since the embodiments are provided to exemplify the technique in the present disclosure, it is possible to make various changes, substitutions, additions, omissions, and the like within the scope of claims and its equivalents.

The present disclosure can be widely used for electronic apparatuses each including a first unit and a second unit.

What is claimed is:

1. A casing for an electronic apparatus, wherein
a plurality of ribs are formed on an inner surface of the casing, and
the plurality of ribs form an isogrid structure in which a plurality of polygonal segments are arranged adjacent to each other, and
the plurality of ribs include an annular rib provided at vertices of a plurality of adjacent polygons and ribs radially extending from the annular rib at predetermined angular intervals in a circumferential direction and constituting sides of the polygon, and
an inner periphery of the annular rib forms a non-circular shape, wherein a width of a portion of the annular rib to which one certain rib of the ribs constituting sides of the polygon is connected is larger than a width of a portion of the annular rib to which one other rib of the ribs constituting sides of the polygon is connected.

2. The casing according to claim 1, wherein
the casing is a cast product.

3. The casing according to claim 2, wherein
the certain rib is located on the upper stream in a direction of inflow of molten material in cast molding with respect to the annular rib.

4. An electronic apparatus comprising the casing for an electronic apparatus according to claim 1.

5. An electronic apparatus comprising the casing for an electronic apparatus according to claim 2.

6. An electronic apparatus comprising the casing for an electronic apparatus according to claim 3.

\* \* \* \* \*